United States Patent
Ivaska et al.

(10) Patent No.: US 12,095,192 B2
(45) Date of Patent: Sep. 17, 2024

(54) COMPRESSIBLE CONDUCTIVE ELASTOMER FOR ELECTRICAL CONNECTION OF ORTHOGONAL SUBSTRATES

(71) Applicant: Vitesco Technologies USA, LLC, Auburn Hills, MI (US)

(72) Inventors: David W Ivaska, Chicago, IL (US); Colin P Dent, Antioch, IL (US); Andrew B Herrmann, Inverness, IL (US); Szymon J Sambor, Chicago, IL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 893 days.

(21) Appl. No.: 17/018,473

(22) Filed: Sep. 11, 2020

(65) Prior Publication Data

US 2021/0184385 A1    Jun. 17, 2021

Related U.S. Application Data

(60) Provisional application No. 62/947,440, filed on Dec. 12, 2019.

(51) Int. Cl.
| | |
|---|---|
| *H01R 13/24* | (2006.01) |
| *G01L 1/18* | (2006.01) |
| *G01L 19/00* | (2006.01) |
| *G01L 19/06* | (2006.01) |
| *H01R 12/61* | (2011.01) |
| *H01R 12/73* | (2011.01) |
| *H01R 13/6471* | (2011.01) |
| *H05K 1/03* | (2006.01) |

(52) U.S. Cl.
CPC ............ *H01R 13/2414* (2013.01); *G01L 1/18* (2013.01); *G01L 19/0084* (2013.01);
(Continued)

(58) Field of Classification Search
CPC ............ H01R 13/2414; H01R 13/6471; H01R 12/613; H01R 12/737; H01R 4/64;
(Continued)

(56) References Cited

U.S. PATENT DOCUMENTS

| | | |
|---|---|---|
| 3,971,610 A | 7/1976 | Buchoff et al. |
| 5,180,311 A | 1/1993 | Schreiber et al. |
| (Continued) | | |

FOREIGN PATENT DOCUMENTS

| | | |
|---|---|---|
| CN | 1231030 A | 10/1999 |
| CN | 101247028 A | 8/2008 |
| (Continued) | | |

OTHER PUBLICATIONS

Chinese Office Action dated Jul. 6, 2022 for corresponding Patent Application No. 202011441341.4.

*Primary Examiner* — Suman K Nath (57) ABSTRACT

An electronics assembly which includes a grounding connection, having a housing, a connector, a portion of the connector formed around the housing, a recess portion integrally formed as part of the connector, a substrate located in proximity to the connector, and circuitry mounted to the substrate such that the circuitry is at least partially disposed in a cavity formed as part of the connector. A conductor is mounted to the connector such that the conductor is located in the recess, and the conductor is in contact with the housing and the substrate. A grounding connection is formed between the circuitry and the housing when the conductor is in contact with the housing and the substrate. The conductor may be made of an elastomeric material, and the conductor deforms when the substrate is placed in proximity to the connector.

16 Claims, 6 Drawing Sheets

(52) U.S. Cl.
CPC .......... *G01L 19/069* (2013.01); *H01R 12/613* (2013.01); *H01R 12/737* (2013.01); *H01R 13/6471* (2013.01); *H05K 1/0393* (2013.01); H05K 2201/0314 (2013.01)

(58) Field of Classification Search
CPC ..... G01L 1/18; G01L 19/0084; G01L 19/069; G01L 19/14; H05K 1/0393; H05K 2201/0314; G01D 11/245; G01N 27/4078; G01N 29/02; G01N 2291/021; G01J 5/04; G01P 1/02; G01R 1/04; G10K 11/004

See application file for complete search history.

(56) References Cited

U.S. PATENT DOCUMENTS

| | | | |
|---|---|---|---|
| 5,244,395 A | 9/1993 | DeSantis | |
| 5,261,158 A | 11/1993 | Schreiber | |
| 5,343,757 A | 9/1994 | Tate | |
| 6,212,955 B1 | 4/2001 | Tanaka et al. | |
| 6,282,966 B1 | 9/2001 | Probst et al. | |
| 6,457,368 B1 | 10/2002 | Sasaki et al. | |
| 10,062,988 B1* | 8/2018 | Vinther | H01R 13/2421 |
| 2005/0132813 A1* | 6/2005 | Aratani | G01L 19/0645 73/715 |
| 2012/0192623 A1* | 8/2012 | Adami | G01D 4/004 73/31.05 |
| 2013/0192361 A1* | 8/2013 | Herderich | G01D 11/245 73/431 |
| 2017/0350778 A1 | 12/2017 | Gadini | |

FOREIGN PATENT DOCUMENTS

| | | |
|---|---|---|
| CN | 107250752 A | 10/2017 |
| EP | 0677727 A2 | 10/1995 |
| JP | 20000162077 A | 6/2000 |
| JP | 20000205983 A | 7/2000 |
| JP | 2000304640 A | 11/2000 |
| JP | 20080185334 A | 8/2008 |
| KR | 20120077210 A | 7/2012 |
| KR | 101395850 B1 | 5/2014 |
| KR | 20160001364 A | 1/2016 |

* cited by examiner

COMPRESSIBLE CONDUCTIVE ELASTOMER FOR ELECTRICAL CONNECTION OF ORTHOGONAL SUBSTRATES

CROSS-REFERENCE TO RELATED APPLICATIONS

This application claims the benefit of provisional application 62/947,440 filed Dec. 12, 2019. The disclosure of the above application is incorporated herein by reference.

FIELD OF THE INVENTION

The invention relates generally to a grounding connection for a pressure sensor assembly, which includes at least one conductive elastomer plug as the grounding connection between a piezoresistive pressure cell and a housing.

BACKGROUND OF THE INVENTION

Pressure sensor elements typically require electrical grounding to reduce or eliminate electromagnetic interference (EMI). Several different types of solutions have been developed, but these solutions have included conductive elastomers which are typically used to make electrical or thermal contact between parallel substrates, as flexible EMI shielding gaskets, or are adhesively bonded to one or more flexible substrates such as in a form-in-place operation.

However, these solutions are not cost effective, and are not sufficient for providing an electrical connection between two rigid, substantially orthogonal opposed substrates.

Accordingly, there exists a need for a conductor which may be economically installed without any secondary processes or additional materials, and functions as a stand-alone component between two substrates which achieves a desired electrical connection.

SUMMARY OF THE INVENTION

In one embodiment, the present invention is a pressure sensor assembly which includes an electrical connection between two substantially orthogonal rigid substrates by using a compressible electrically conductive elastomer.

The compressible electrically conductive elastomer provides a sufficiently low resistance electrical connection between two rigid, substantially orthogonally opposed substrates without the need for additional manufacturing processes such as soldering, applying conductive adhesive, or attaching a flexible circuit connection. No additional joining materials are necessary to create the electrical connection; the deformation of the conductive elastomer results in an application of force against the surfaces of the two substrates.

In an embodiment, a conductive elastomer is extruded, die cut or molded to a specific shape, such as a plug, allowing simultaneous compression in two substantially orthogonal directions, creating a low resistance electrical connection between the two substantially orthogonally opposed rigid substrates.

In an embodiment, the conductive elastomer is generally cylindrical with additional optional geometric features aiding in compression and surface contact, such as a hollow core and external ribs or teeth, creating a gear-like shape. Radial compression of the generally cylindrical conductive elastomer is achieved by installation of the elastomer with an interference fit against a first conductive substrate, with the first conductive substrate positioned substantially tangential to the generally cylindrical shape, using a portion of the outer surface of the cylindrical elastomer shape as the contact area. Biaxial compression of the elastomer then occurs when a second conductive substrate is assembled against one flat end of the generally cylindrical shape.

In an embodiment, the pressure sensor assembly includes an electronics housing, and a non-conductive cavity in the electronics housing is used to secure the conductive elastomer in place by an interference fit, allowing for compression in the radial direction against a vertically opposed rigid substrate (or, alternately, a conductive contact area on the vertically opposed rigid substrate) and for compression in the axial direction against a horizontally opposed rigid conductive substrate (or, alternately, a conductive contact area on the horizontally opposed rigid conductive substrate).

The two substrates independently create compression upon the elastomer in generally orthogonal directions. As such, the amount of compression in each direction—which may affect the function of a low resistance electrical connection—may be tailored by simply adjusting the dimensions of the generally cylindrically shaped elastomer rather than modifying the mating components.

A conductive elastomer material that is generally electrically isotropic is used, allowing for conductivity in orthogonal directions simultaneously, thus creating a sufficiently low resistance electrical connection between the two substantially orthogonal substrates.

Multiple raw material combinations are possible to achieve an effective solution depending on the substrates used in the application and the environment to which the assembly is exposed.

In an embodiment, the present invention is an electronics assembly which includes a grounding connection, having a housing, a connector, a portion of the connector formed around the housing, a recess portion integrally formed as part of the connector, a substrate located in proximity to the connector, and circuitry mounted to the substrate such that the circuitry is at least partially disposed in a cavity formed as part of the connector. A conductor is mounted to the connector such that the conductor is located in the recess, and the conductor is in contact with the housing and the substrate. A grounding connection is formed between the circuitry and the housing when the conductor is in contact with the housing and the substrate.

In an embodiment, the conductor is made of an elastomeric material, and the conductor deforms when the substrate is placed in proximity to the connector. In an embodiment, the elastomeric material is isotropic.

In an embodiment, the conductor is a plug, and the plug includes a body portion, and a plurality of ribs integrally formed as part of the body portion. The plug is deformed when the plug is in contact with the connector and the pressure cell, and a first portion of the plurality of ribs is in contact with the connector, and a second portion of the plurality of ribs is in contact with the housing.

In an embodiment, the plug includes a first outer surface on one side of the body portion and each of the plurality of ribs, and a second outer surface on another side of the body portion and each of the plurality of ribs. The substrate is in contact with the first outer surface, and a lower surface and the cavity is in contact with the second outer surface.

In an embodiment, the substrate and the housing are orthogonal to one another.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
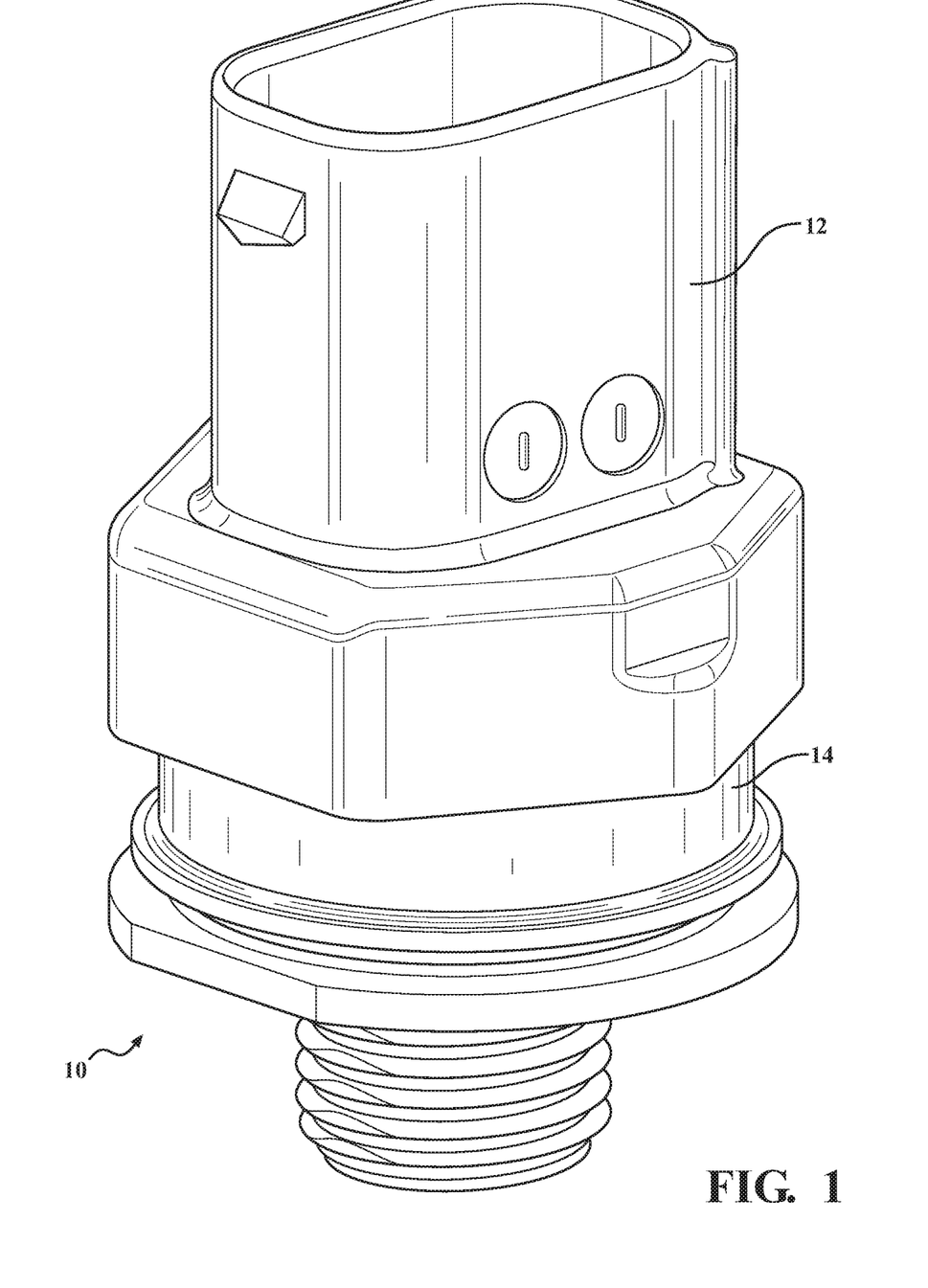
FIG. 1 is perspective view of a pressure sensor assembly having at least one grounding connection, according to embodiments of the present invention.
Figure 2:
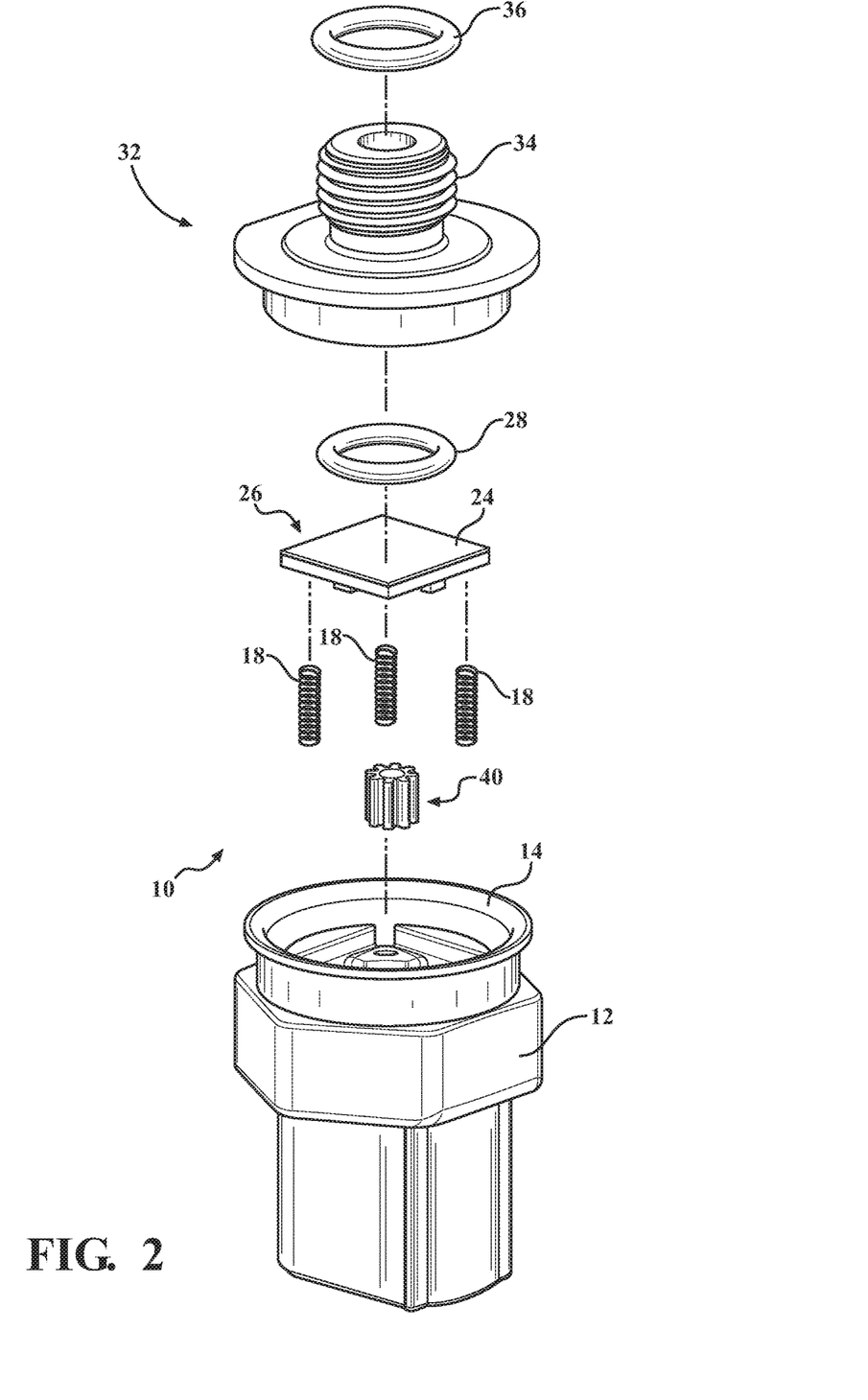
FIG. 2 is a first exploded view of a pressure sensor assembly having at least one grounding connection, according to embodiments of the present invention.
Figure 3:
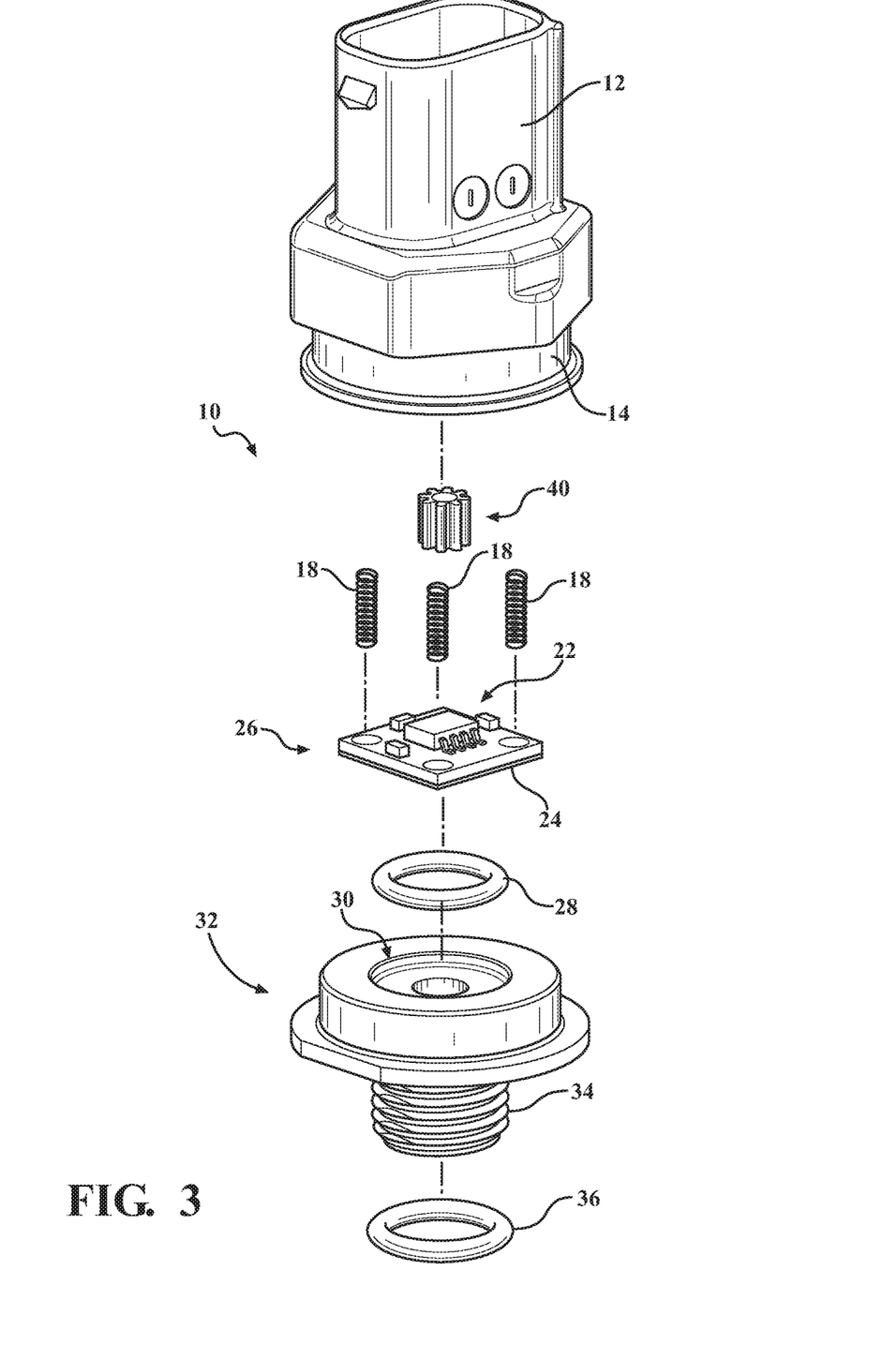
FIG. 3 is a second exploded view of a pressure sensor assembly having at least one grounding connection, according to embodiments of the present invention.
Figure 4:
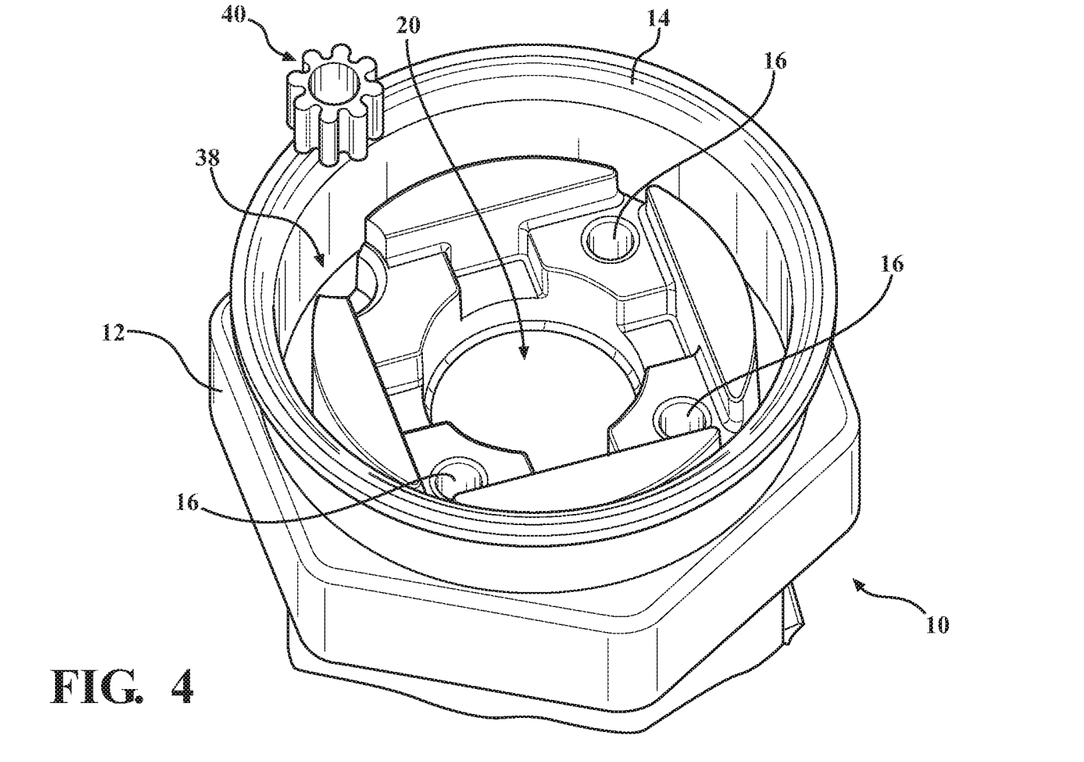
FIG. 4 is an enlarged perspective view of part of a pressure sensor assembly during the assembly of at least one conductive elastomer plug used for at least one grounding connection, according to embodiments of the present invention.
Figure 5:
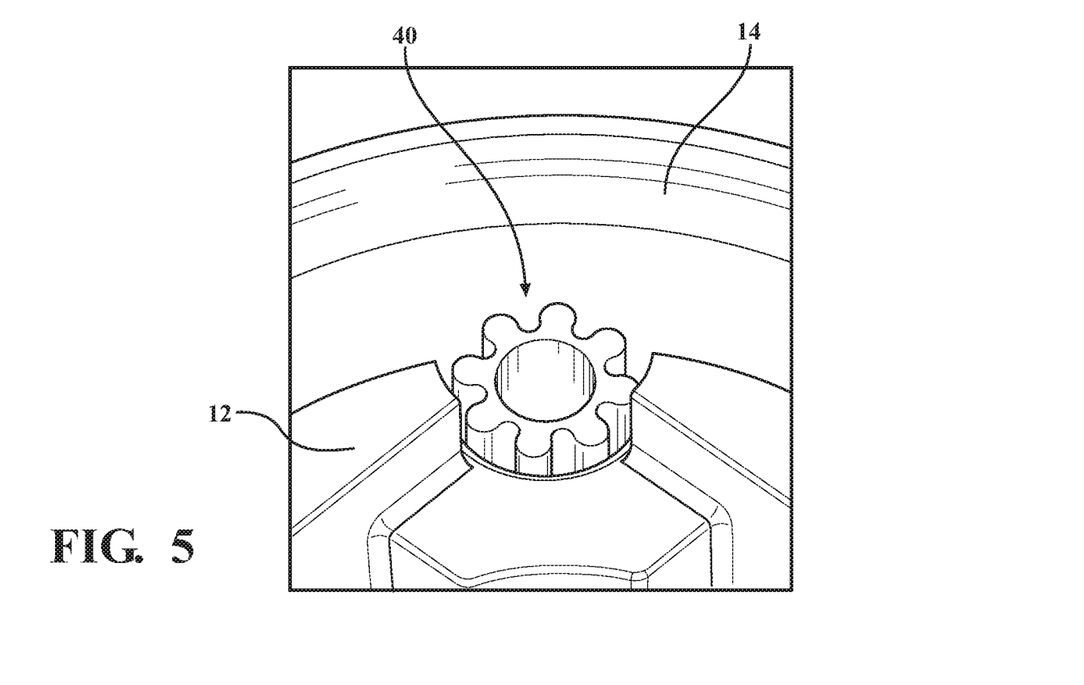
FIG. 5 is a perspective view of part of a pressure sensor assembly after the assembly of at least one conductive elastomer plug used for at least one grounding connection, according to embodiments of the present invention.
Figure 6:
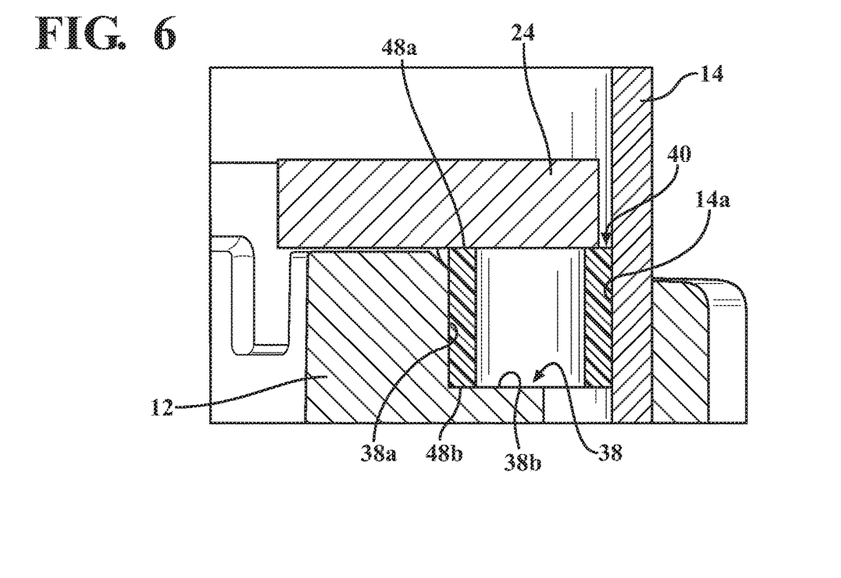
FIG. 6 is a sectional view of part of a pressure sensor assembly having at least one grounding connection, according to embodiments of the present invention.

An embodiment of a pressure sensor assembly according to the present invention is shown in FIG. 1, generally at 10. Referring to the Figures generally, the assembly 10 is an absolute pressure sensor, and includes a connector 12 which is molded around part of an aluminum housing 14. Integrally formed as part of the connector 12 are several apertures 16, and a portion of a corresponding spring 18 is located in each aperture 16. Also formed as part of the connector 12 is a cavity, shown generally at 20. Disposed in the cavity 20 is circuitry, which is part of a signal conditioning Application Specific Integrated Circuit (ASIC), shown generally at 22, mounted to a support substrate 24, which together form a pressure cell, shown generally at 26. The substrate 24 is supported by the springs 18, and the use of the springs 18 allows for the location of the pressure cell 26 to have various tolerances, and still maintain proper electrical connections, and for the circuitry 22 to be properly located in the cavity 20.

In contact with the back surface of the substrate 24 is an O-ring 28, and the O-ring 28 is partially disposed in a recess 30 formed as part of a port 32. Integrally formed as part of the port 32 is a threaded portion 34. A second O-ring 36, which is located on a back surface of the port 32 such that the threaded portion 34 extends through the O-ring 36, provides sealing between the port 32 and another component.

Figure 7:
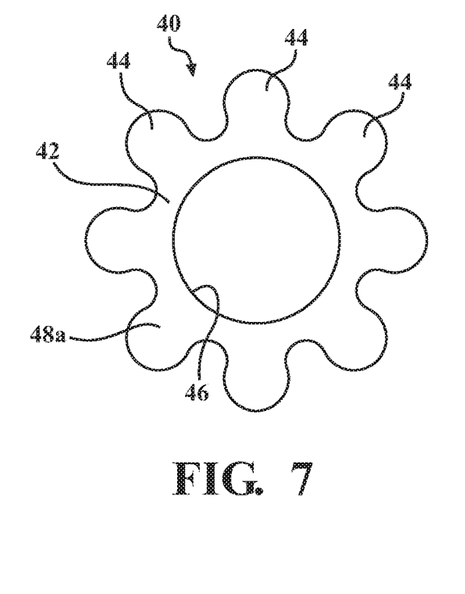
FIG. 7 is a top view of a conductive elastomer plug, used for at least one grounding connection, which is part of a pressure sensor assembly, according to embodiments of the present invention.
Figure 8:
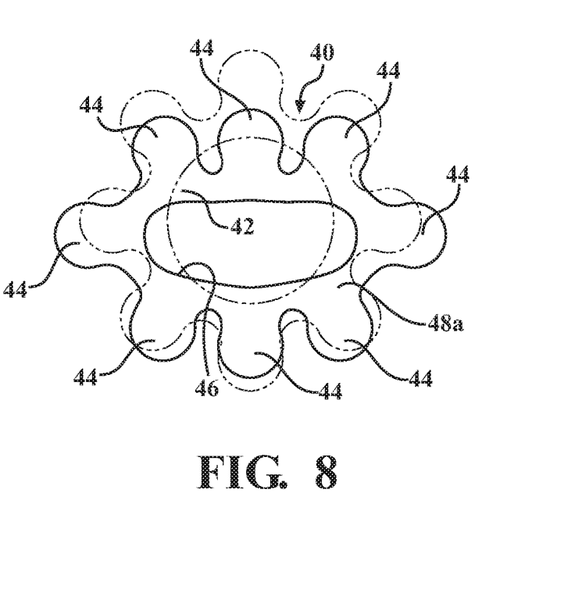
FIG. 8 is a top view of a conductive elastomer plug that has been compressed, used for at least one grounding connection, where the conductive elastomer plug is part of a pressure sensor assembly, according to embodiments of the present invention.
Figure 9:
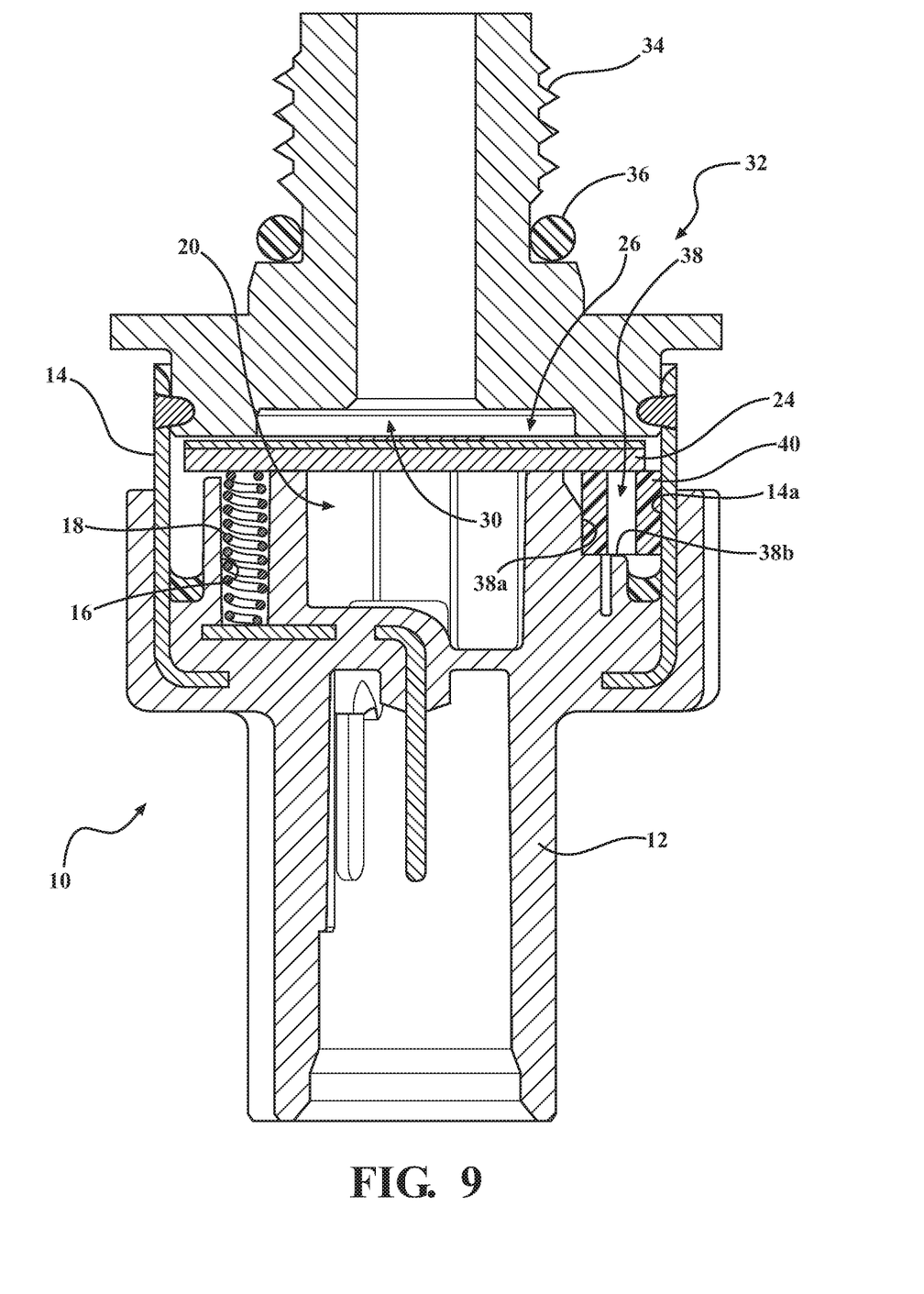
FIG. 9 a sectional view of a pressure sensor assembly having at least one grounding connection, according to embodiments of the present invention.

Referring to FIGS. 4-6 and 9, also formed as part of the connector 12 is a recess portion, shown generally at 38, and the recess portion 38 has an inner sidewall 38a. A conductive plug, shown generally at 40, is located in the recess portion 38, such that the plug 40 is partially surrounded by the inner sidewall 38a, and the plug 40 is in contact with the substrate 24 and an inner surface 14a of the housing 14. In this embodiment, the conductive plug 40 is made of a conductive elastomeric material, but it is within the scope of the invention that the plug 40 may be made of other materials as well. In an embodiment, the plug 40 may be made of an elastomer material which is isotropic. The plug 40 is disposed in the recess portion 38 such that there is an interference fit between the plug 40 and inner sidewall 38a of the recess portion 38, and an interference fit between the plug 40 and the inner surface 14a of the housing 14, such that the plug 40 is compressed by the sidewall 38a and the inner surface 14a in a first orthogonal direction, which results in a deformation of the plug 40. When pressure cell 26 is placed in proximity to the connector 12 such that the pressure cell 26 is supported by the springs 18, there is also an interference fit between the plug 40 and a lower surface 38b of the recess portion 38, and an interference fit between the plug 40 and the substrate 24, such that the plug 40 is compressed by the lower surface 38b and the substrate 24 in a second orthogonal direction and there is additional deformation of the plug 40. An example of the plug 40 being in a relaxed position is shown in FIG. 7, and an example of the plug 40 being in a deformed position is shown in FIG. 8.

The plug 40 being in contact with the housing 14 and the substrate 24 results in a grounding of the circuitry 22 of the pressure cell 26. The ability for the plug 40 to deform allows for an electrical connection between the pressure cell 26 and the housing 14 without the need for additional manufacturing processes, and no additional joining materials are required to create the electrical connection.

In the embodiment shown, the plug 40 includes a body portion 42, and several geometric features, which in this embodiment are external ribs 44. The body portion 42 is generally circular, and has an aperture 46, as well a first outer surface 48a and a second outer surface 48b. When assembled, a portion of the external ribs 44 are in contact with the inner sidewall 38a, and another portion of the external ribs 44 are in contact with the inner surface 14a. Also, when assembled, a portion of the support substrate 24 is in contact with the first outer surface 48a, and the lower surface 38b of the recess portion 38 is in contact with the second outer surface 48b. While one embodiment of the shape of the plug 40 has been described, it is within the scope of the invention that other shapes may be used. The shape of the plug 40 may be changed depending upon the shape and space between the surrounding substrates the plug 40 is connecting. The plug 40 may be shaped to accommodate the housing 14, the recess portion 38, or the support substrate 24 having different shapes. For example, the plug 40 may or may not have the geometric features, and shapes of the plug 40 may include, but are not limited to, round, square, rectangle, oval, trapezoid, a hollow shape, or irregular shape. The uncompressed or undeformed shape of the plug 40 is designed to be larger than the as-assembled shape of the plug 40, such that the plug 40 is compressed in two orthogonal directions, to facilitate the conductive connection between the two orthogonal substrates.

In the embodiment shown, the inner surface 14a and the surface of the substrate 24 in contact with the plug 40 are orthogonal to one another. Therefore, the plug 40 provides an electrical connection between two orthogonal surfaces.

The shape of the plug 40 in conducive to elastic deformation. Referring again to FIGS. 7 and 8, the plug 40 is shown being uncompressed in FIG. 7 and compressed in the radial direction in FIG. 8.

While the present invention has been described for use with a pressure sensor assembly, it is within the scope of the invention that the present invention may be used with any type of electronics assembly requiring two orthogonal substrates to have a ground connection with floating mechanical tolerances.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
a pressure sensor assembly, including:
a housing having an inner surface;
a connector, the housing connected to the connector;
at least one aperture integrally formed as part of the connector;
a spring at least partially disposed in the aperture;
a pressure cell in contact with the spring, the pressure cell connected to the connector such that the pressure cell is partially surrounded by the housing, and the pressure cell is substantially orthogonal to at least a portion of the inner surface;
a conductor in contact with the pressure cell, the inner surface of the housing, and the connector such that the conductor is compressed in two orthogonal directions;
a recess portion integrally formed as part of the connector, the conductor at least partially disposed in the recess;
a grounding connection formed by the connection between the pressure cell and the inner surface of the housing when the conductor is in contact with the housing and the pressure cell.

2. The apparatus of claim 1, the pressure cell further comprising:
circuitry; and
a support substrate, the circuitry connected to the support substrate;
wherein the grounding connection is formed between the circuitry and the housing when the conductor is in contact with the inner surface of the housing and the substrate.

3. The apparatus of claim 1, the conductor further comprising a plug.

4. The apparatus of claim 3, the plug further comprising:
a body portion; and
at least one geometric feature integrally formed as part of the body portion;
wherein the plug is deformed when the plug is in contact with the connector and the pressure cell.

5. The apparatus of claim 4, the at least one geometric feature further comprising a plurality of ribs, and when the plug is in contact with the connector and the pressure cell, a first portion of the plurality of ribs is in contact with the connector, and a second portion of the plurality of ribs is in contact with the inner surface of the housing.

6. The apparatus of claim 4, the plug further comprising:
a first outer surface on one side of the body portion and at least one geometric feature; and
a second outer surface on another side of the body portion and at least one geometric feature;
wherein the pressure cell is in contact with the first outer surface, and a lower surface and the cavity is in contact with the second outer surface.

7. The apparatus of claim 1, the conductor further comprising an elastomeric material, wherein the conductor deforms when the substrate is placed in proximity to the connector.

8. The apparatus of claim 7, wherein the elastomeric material is isotropic.

9. The apparatus of claim 1, further comprising:
a port connected to the housing; and
an aperture integrally formed as part of the port;
wherein the pressure cell is exposed to media in the aperture of the port.

10. The apparatus of claim 1, wherein a portion of the connector is integrally formed around the housing.

11. An electronics assembly which includes a grounding connection, comprising:
a housing having an inner surface;
a connector, a portion of the connector formed around the housing;
at least one aperture integrally formed as part of the connector;
a spring at least partially disposed in the aperture;
a recess portion integrally formed as part of the connector;
a substrate in contact with the spring, the substrate located in proximity to the connector such that the substrate is substantially orthogonal to at least a portion of the inner surface;
circuitry mounted to the substrate such that the circuitry is at least partially disposed in a cavity formed as part of the connector; and
a conductor mounted to the connector such that the conductor is located in the recess portion, and the conductor is in contact with an inner surface of the housing, the connector, and the substrate such that the conductor is compressed in two orthogonal directions;
wherein a grounding connection is formed between the circuitry and the housing when the conductor is in contact with the inner surface of the housing and the substrate.

12. The electronics assembly of claim 11, the conductor further comprising an elastomeric material, wherein the conductor deforms when the substrate is placed in proximity to the connector.

13. The electronics assembly of claim 12, wherein the elastomeric material is isotropic.

14. The electronics assembly of claim 11, the conductor further comprising a plug.

15. The electronics assembly of claim 14, the plug further comprising:
a body portion; and
a plurality of ribs integrally formed as part of the body portion;
wherein the plug is deformed when the plug is in contact with the connector and the pressure cell, and a first portion of the plurality of ribs is in contact with the connector, and a second portion of the plurality of ribs is in contact with the inner surface of the housing.

16. The electronics assembly of claim 14, the plug further comprising:
   a first outer surface on one side of the body portion and each of the plurality of ribs; and
   a second outer surface on another side of the body portion and each of the plurality of ribs;
   wherein the substrate is in contact with the first outer surface, and a lower surface and the cavity is in contact with the second outer surface.

* * * * *